(12) United States Patent  (10) Patent No.: US 7,733,732 B2
Sichert et al.  (45) Date of Patent: Jun. 8, 2010

(54) REFRESHING THE CONTENT OF A MEMORY CELL OF A MEMORY ARRANGEMENT

(75) Inventors: Christian Sichert, Munich (DE); Paul Wallner, Prien (DE)

(73) Assignee: Qimonda AG, Munich (DE)

( * ) Notice: Subject to any disclaimer, the term of this patent is extended or adjusted under 35 U.S.C. 154(b) by 317 days.

(21) Appl. No.: 11/856,621

(22) Filed: Sep. 17, 2007

(65) Prior Publication Data
US 2008/0068913 A1    Mar. 20, 2008

(30) Foreign Application Priority Data
Sep. 15, 2006  (DE) .................. 10 2006 043 456

(51) Int. Cl.
*G11C 7/00*  (2006.01)
(52) U.S. Cl. .................. 365/222; 365/226; 365/230.03
(58) Field of Classification Search .................. 365/222, 365/63, 230.03, 226
See application file for complete search history.

(56) References Cited

U.S. PATENT DOCUMENTS

| 6,693,837 | B2 * | 2/2004 | Schaefer et al. ............. 365/222 |
| 6,868,029 | B2 | 3/2005 | Ishikawa et al. |
| 2002/0126560 | A1 * | 9/2002 | Cowles et al. ............... 365/222 |
| 2003/0231540 | A1 * | 12/2003 | Lazar et al. ................. 365/222 |

FOREIGN PATENT DOCUMENTS

DE    10110157    4/2005

* cited by examiner

*Primary Examiner*—Son Dinh
(74) *Attorney, Agent, or Firm*—Dicke, Billig & Czaja, PLLC (57) ABSTRACT

A method of refreshing the content of a memory cell of a memory arrangement includes selectively controlling a refreshing device of the memory arrangement via an interface of the memory arrangement or by an internal control device of the memory arrangement to refresh the content of the memory arrangement.

16 Claims, 7 Drawing Sheets

REFRESHING THE CONTENT OF A MEMORY CELL OF A MEMORY ARRANGEMENT

CROSS-REFERENCE TO RELATED APPLICATIONS

This Utility Patent Application claims priority to German Patent Application No. DE 10 2006 043 456.0, filed on Sep. 15, 2006, which is incorporated herein by reference.

BACKGROUND

The present disclosure relates to a method for refreshing the content of a memory cell of a memory arrangement and a memory arrangement for carrying out such a method.

SUMMARY

One embodiment provides a method of refreshing the content of a memory cell of a memory arrangement. The method includes selectively controlling a refreshing device of the memory arrangement via an interface of the memory arrangement or by an internal control device of the memory arrangement to refresh the content of the memory arrangement.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of various exemplary embodiments described herein may be combined with each other, unless specifically noted otherwise.

An embodiment of a method for refreshing the content of a memory cell of a memory arrangement includes controlling a refreshing device of the memory arrangement to refresh the content of the memory cell selectively via an interface of the memory arrangement or by an internal control device of the memory arrangement.

In one embodiment, if the refreshing device of the memory arrangement is controlled, for example, by a computer system connected to the memory arrangement via the interface of the memory arrangement, the computer system ensures that the contents of the memory cells of the memory arrangement are refreshed at sufficient intervals in that the computer system outputs appropriate commands to refresh memory cells to the memory arrangement via the interface. In one embodiment, since the computer system controls the refreshing device, it can control the refresh processes in terms of time in such a way that the overall system power of the computer system is reduced only minimally by the refresh processes and yet refreshing of all the memory cells is ensured. In one embodiment, if the refreshing device is controlled by the internal control device of the memory arrangement, the internal control device ensures that the memory cells of the memory arrangement are refreshed at sufficient intervals of time, without activation via the interface being necessary. Thus, for example, in one embodiment, in a standby operating mode of a computer system, communication between the computer system and a memory arrangement can be completely switched off, without the content of the memory cells of the memory arrangement being lost. This embodiment leads to considerable energy saving in standby operation of the computer system.

An embodiment of a memory arrangement comprises several memory cells which are refreshed cyclically. The memory cells are refreshed cyclically in a predetermined order, irrespective of whether the refreshing device is controlled via the interface or by the internal control device. In this embodiment even after a change in control of the refreshing device from the interface to the internal control device or vice versa, refreshing within the required refreshing intervals can be ensured for all the memory cells of the memory arrangement.

An embodiment of a memory arrangement comprises an interface, at least one memory cell, a refreshing device configured for refreshing the content of the at least one memory cell, an internal control device configured for controlling the refreshing device, and a switchover device connected to the internal control device, the interface, and the refreshing device.

In an embodiment, the interface transmits data and commands in the form of data packets according to a predetermined protocol between the memory arrangement and a computer system, for example. The switchover device optionally switches a signal from the interface or a signal from the internal control device to the refreshing device to control the refreshing of the content of the at least one memory cell.

In one embodiment of this memory arrangement, refreshing the memory cells can selectively be controlled via the interface of a computer system connected to the memory arrangement, for example, or via the internal control device, wherein refreshing the memory cells is continued constantly, irrespective of whether controlling takes place via the interface or the internal control device. In one embodiment, if controlling takes place via the interface of a computer system, for example, the computer system ensures that the memory cells of the memory arrangement are refreshed at intervals which are sufficiently small in time that they do not lose their content, wherein the computer system can simultaneously choose the times for refreshing in such a way that the overall performance of the computer system is reduced only minimally by the refresh processes. In one embodiment, if the refreshing device is controlled by the internal control device, refreshing of the contents of the memory cells can be ensured, without commands having to be transmitted via the interface of the memory arrangement. Therefore, in one embodiment, in the case of a standby operating mode, no communication is necessary between the computer system and the memory arrangement and yet the contents of the memory cells of the memory arrangement are retained.

Hereinafter, embodiments of the invention are described in more detail with reference to the drawings.

Figure 1:
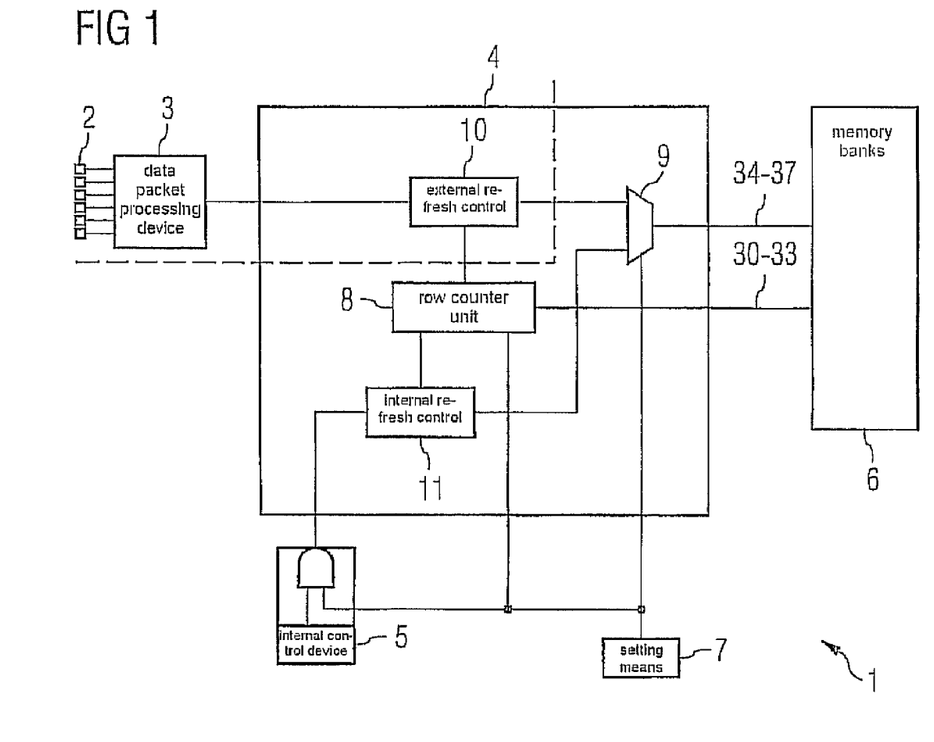
FIG. 1 illustrates a schematic illustration of a memory arrangement according to an embodiment, comprising an interface, a refreshing device, an internal control device, and a memory bank with memory cells.
Figure 8:
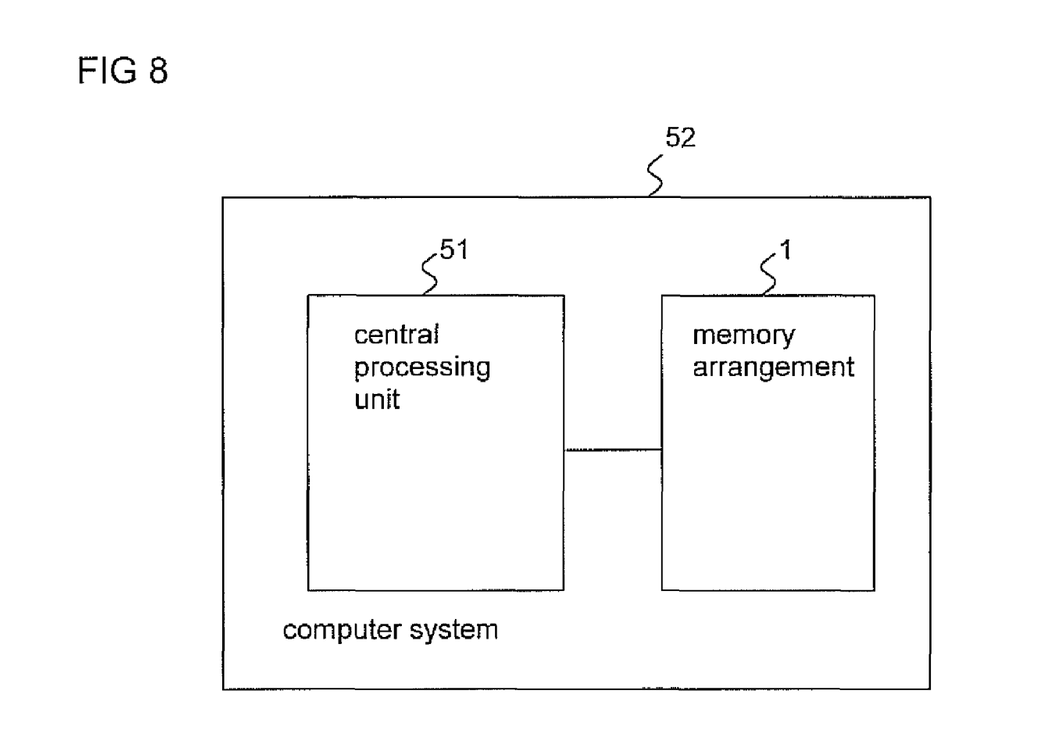
FIG. 8 illustrates an embodiment of a computer system.

FIG. 1 illustrates one embodiment of a memory arrangement 1, comprising an interface 2, a data packet processing device 3, a refreshing device 4, an internal control device 5, memory banks 6, and a setting means 7. The interface 2 may have six ports, for example, via which data packets according to a predetermined protocol are exchanged with a central processing unit 51 of a computer system 52 connected thereto as illustrated in FIG. 8. The data packets may comprise write data, read data, addressing data, or command data. The interface 2 is connected to a data packet processing device 3, which processes the data packets received via the interface 2 and triggers appropriate actions within the memory arrangement, or which packs states or items of information from the memory arrangement to be transmitted to the computer system into data packets and sends them to the computer system via the interface 2.

The data packet processing device 3 is connected to the refreshing device 4. The refreshing device 4 is additionally connected to the internal control device 5 and the setting means 7 for setting an operating mode of the memory arrangement. Depending on the state of the setting means 7, refreshing the memory banks 6, which are likewise connected to the refreshing device 4 is possible selectively via the interface 2 and the data packet processing device 3 or via the internal control device 5.

The memory cells of a memory bank cannot all be refreshed at the same time, but are refreshed in small units, referred to as rows. To refresh a row of a memory bank the memory bank is selected and the address of the row to be refreshed applied to the address lines of the memory bank. Via a refresh signal, the memory cells of this row of the memory bank are then refreshed and the memory bank is subsequently deselected. Selecting or deselecting a memory bank is also referred to as opening or closing a memory bank. Normally all rows of a memory bank are refreshed sequentially within a preset period of time and this process is continually repeated. The preset time period corresponds to the maximum time which may elapse before a memory cell has to be refreshed again, so that it does not lose its content.

For carrying out these refresh processes, the refreshing device 4 comprises a row counter unit 8, switchover unit 9, an external refresh control 10 and an internal refresh control 11.

The row counter unit 8 is connected to the memory banks 6 and provides the row addresses for the refresh process. The external refresh control 10 and the internal refresh control 11 are each connected to the inputs of the switchover unit 9, which selectively uses memory bank selection information of the external refresh control 10 or the internal refresh control 11 depending on the setting means 7 to control the memory banks 6.

The mode of functioning of the refreshing device 4 in two possible operating states which can be set by the setting means 7, the active operating state and the standby operating state, are described below.

One example embodiment of an active operating state is as follows.

In the active operating state, the internal control device 5, which is connected to the setting means 7, is deactivated, so it does not initiate any refresh processes. The internal refresh control 11 is thus likewise inactive in this operating state. The switchover unit 9, which is likewise connected to the setting means 7, in the active operating state switches the bank selection information through from the external refresh control 10 to the memory banks 6. The external refresh control 10 is controlled by the data packet processing device 3 via connecting lines.

For triggering a refresh process, a computer system connected to the memory arrangement 1 sends an appropriate command in a data packet via the interface 2 to the data packet processing device 3 of the memory arrangement 1. As well as the command for refreshing, the data packet also contains a memory bank selection information, which specifies the memory bank to be refreshed. The command for refreshing is forwarded together with the memory bank selection information to the external refresh control 10. The external refresh control 10 forwards the memory bank selection information to the memory banks 6 via the switchover unit 9 and thus selects a memory bank for refreshing. The row counter unit 8 is then controlled by the external refresh control 10 via connecting lines in such a way that the row counter unit 8 outputs a row addressing information to the memory banks. The external refresh control 10 then outputs a refresh signal to the memory banks 6, where the memory cells of the selected row of the selected memory bank 6 are refreshed and the memory bank is deselected subsequently. In the row counter unit 8, the counter for the selected memory bank is increased by one. This completes the refresh process for a row of a memory bank, wherein the controlling is done by the commands of the connected computer system and no additional timing control or clock supply is employed.

In this example embodiment, it is the task of the connected computer system to refresh all the memory banks and all the rows of all the memory banks at sufficiently short intervals. Since the row addressing information is provided by the row counter unit 8, addressing of the rows by the computer system is not necessary in this case.

One embodiment of a standby operating state is as follows.

In the standby operating state the setting means 7 controls the switchover unit 9 in such a way that the memory bank selection information is switched through by the internal refresh control 11 to the memory banks 6. The internal control device 5 is further controlled by the setting means 7. The internal control device may be an oscillator, for example, which, at regular intervals, outputs signals to initiate a refresh process to the internal refresh control 11, to which it is connected via a connecting line. When the internal refresh control 11 receives a signal to initiate a refresh process, it controls the row counter unit 8 and via the switchover unit 9 the memory banks 6 in such a way that one row of memory cells is refreshed in each memory bank in that the memory bank is selected, the row address is applied, the memory cells of the row are refreshed and the memory bank is deselected. In the counter unit 8, the counters for the individual memory banks are increased by one in each case. This process is continually repeated.

The counters in the counter unit 8 are configured in this example embodiment in such a way that they have a counting range which can address the entire number of rows of each memory bank. Once the highest value of a counter has been reached the next count value of this counter is the value zero. Moreover, after a hardware reset, the counters are set to a predetermined value, for example zero.

A configuration of this kind of the memory arrangement 1 ensures that the memory cells of the memory banks 6 are reliably refreshed both in the active operating mode and in the inactive operating mode and even after any amount of switching backwards and forwards between the two operating modes refreshing of the memory cells in the memory banks 6 is ensured, wherein the counter readings of the respective counters continue to be counted constantly.

Setting the setting means 7 into the standby operating mode can be accomplished via a command which is fed to the memory arrangement via the interface according to a predetermined protocol. It is thus possible that, for example, a power-saving standby operating mode can be set in a notebook and that in this standby operating mode no communication is required between the memory arrangement and the computer system to refresh the content of the memory cells of the memory arrangement. In one embodiment, the standby operating mode is also set by the setting means 7 if the data packet processing device 3 determines an error in the communication between the computer system and the memory arrangement 1. In case of a communication error between the computer system and the memory arrangement a loss of data packets might occur, where reliable refreshing of the memory cells of the memory arrangement is no longer ensured. In one embodiment, refreshing of the content of the memory cells is further ensured by changing into the standby operating mode.

In one embodiment, the memory arrangement has various power supply domains, which can be switched on and off selectively. The memory arrangement 1 may, for example, have a standby power supply circuit and an active power supply circuit, wherein, for example, the interface 2, the data packet processing device 3, and the external refresh control 10 are supplied by the active power supply circuit, while the other components are supplied by the standby power supply circuit, so that in the standby operating mode the interface 2, the data packet processing device 3 and the external refresh control 10 can be switched in a de-energized state. In one embodiment, since the interface 2 and the data packet processing device 3 consume a large amount of power, in this way the power consumption of the entire memory arrangement can be reduced in the standby operating mode.

Figure 2:
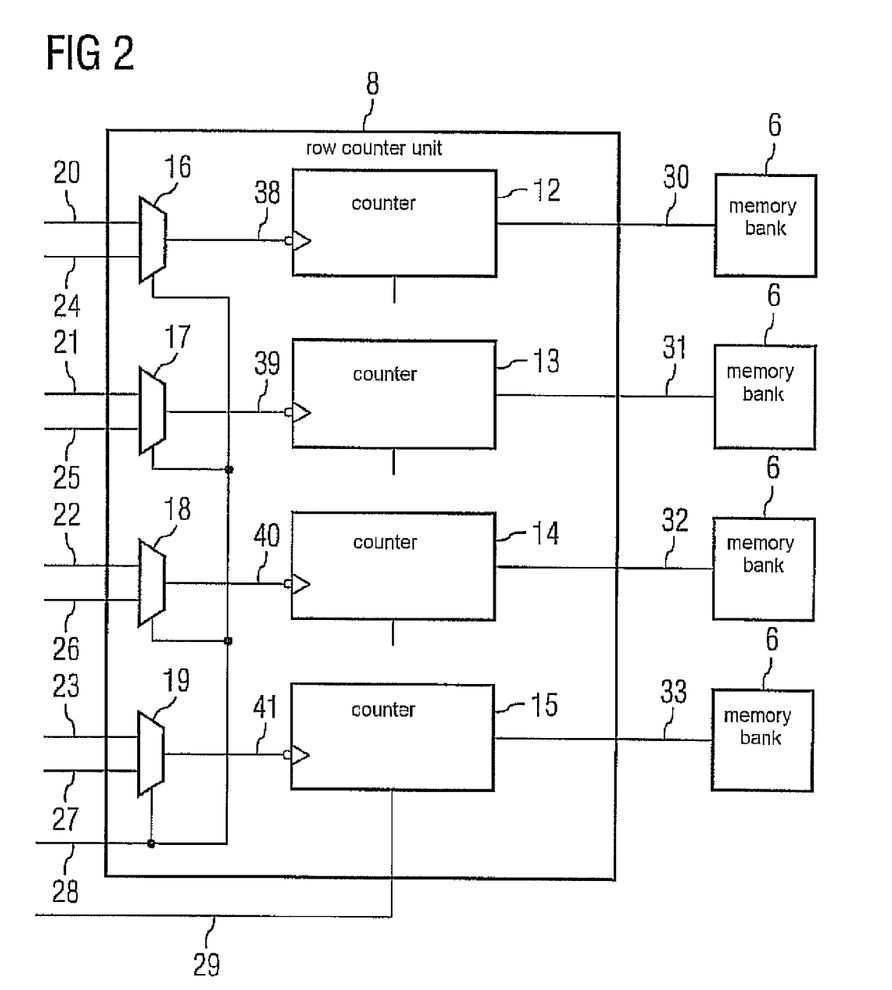
FIG. 2 illustrates an embodiment of a refreshing device for a memory arrangement with four memory banks.

FIG. 2 illustrates one embodiment of a row counter unit 8. In the embodiment illustrated, the row counter unit 8 has four counters 12-15 and four switchover units 16-19. Connecting lines 30-33 connect the outputs of counters 12-15 to one of the memory banks 6 in each case. The control inputs of the counters for increasing the counter content are connected to connecting lines 20-27 via switchover units 16-19 in such a way that in an active operating state of the memory arrangement the counters 12-15 are controlled by the external refresh control 10 via connecting lines 20-23 and in a standby operating mode the counters 12-15 are controlled by the internal refresh control 11 via connecting lines 24-27. For this purpose, connecting lines 20-23 are connected to the external refresh control 10 and connecting lines 24-27 are connected to the internal refresh control 11. Depending on the set operating mode of the memory arrangement the switchover units 16-19 are appropriately switched over via connecting line 28, which is connected to the setting means 7. Via a connecting line 29, which provides a reset signal when the memory arrangement is reset, the counters 12-15 can be set to zero. The counters 12-15 output their current count value to the memory banks 6 via connecting lines 30-33.

As explained in connection with FIG. 1, in the normal operating mode of the memory arrangement a refresh process takes place in such a way that the external refresh control 10 selects one of the memory banks 6, the corresponding row addressing information is fed to this selected memory bank by the corresponding counter 12-15, the refresh command is given to the memory banks 6 by the external refresh control 10, and the corresponding counter 12-15 is increased by one via connecting line 20-23.

In one embodiment, in the standby operating mode, the counters 12-15 are controlled by the internal refresh control 11 via connecting lines 24-27. As described in connection with FIG. 1, in the standby operating mode, a refresh process takes place via the internal refresh control 11 in such a way that the internal refresh control 11 controls connecting lines 34-37 via the switchover unit 9 to select the memory banks 6, while the counters 12-15 provide the row addressing information for the memory banks 6 via connecting lines 30-33. Then, the internal refresh control 11 outputs a signal to carry out the refresh process for the selected memory banks and the selected row information to the memory banks 6 and increases the corresponding counters 12-15 related to the memory banks in which a row has been refreshed.

Figure 3:
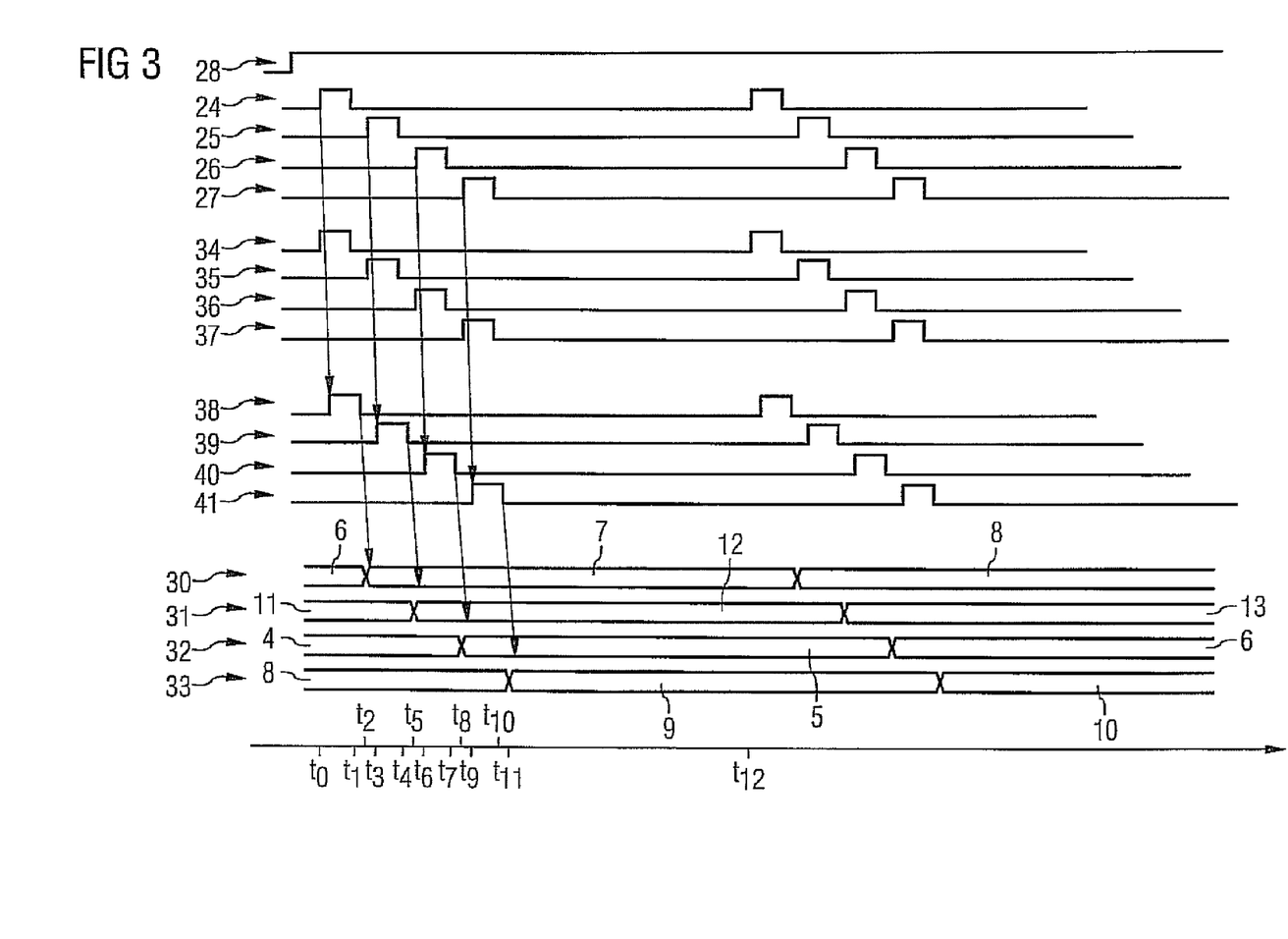
FIG. 3 illustrates an example timing diagram of the refreshing device embodiment of FIG. 2.

FIG. 3 illustrates as an example timing diagram for four memory banks according to an embodiment, in which in each case one row of the four memory banks is refreshed in succession staggered in time. The signal shapes 24-28 and 30-41 illustrated correspond to the signals on the corresponding signal lines 24-28 and 30-41 in FIGS. 1 and 2. The signals 24-27 are transmitted by the internal control device 5 to the internal refresh control 11. These signals can be forwarded directly to the switchover unit 9 by the internal refresh control 11 for selecting a memory bank 6. The switchover unit 9 then transmits these signals to the memory banks 6 via lines 34-37. Signals 24-27 further serve to trigger the refresh process in the memory banks 6 and are moreover used via the switchover units 16-19 to increase the counters 12-15 via lines 38-41. As illustrated in the timing diagram of FIG. 3, in standby operating mode (illustrated via the activated signal 28, provided by the setting means 7) memory cells of the memory banks 6 are refreshed according to an embodiment as follows:

At a time t0, a signal with a rising edge is fed via line 24 to the row counter unit 8. This rising edge is fed to counter 12 via line 38 via the switchover unit 16. Since counter 12 increases its counter content only to the falling edge, the content of counter 12 at first remains unchanged at count value 6. The count value 6 is output via connecting lines 30 as a row addressing information to a first of the memory banks 6. Simultaneously the internal refresh control 11 generates from signal 24 the bank selection signal 34 for the first memory bank 6. Additionally, a signal which carries out the refresh process within the memory banks 6 by selecting the memory banks 6 is output to the memory banks 6 from the internal refresh control 11. Thus, row 6 of the first memory bank 6 is refreshed. At time t1 a falling edge is transmitted to the row counter unit 8 via line 24. Delayed by the propagation time of the switchover unit 16, this falling edge is fed to counter 12 via line 38 at time t2. Thereupon the content of the counter 12 is increased from 6 to 7. Additionally the falling edge of line 24 is fed to the internal refresh control 11, which thereupon deselects the first memory bank 6 via line 34. The refresh process is thus finished for the memory cells of row 6 of the first memory bank 6. Then, a refresh process for the memory cells of row 11 of the second of the memory banks 6 is performed between t3 and t5, a refresh of the memory cells of row 4 of the third of the memory banks 6 is performed between t6 and t8, and a refresh of the memory cells of row 8 of the fourth of the memory banks 6 is performed between t9 and t11. At time t12, the entire process is repeated for all the memory banks, wherein the row addressing information is in this case one higher for all the memory banks than at time t0.

In the example embodiment, since, after reaching their highest value the counters 12-15 reset back to zero, refreshing of the memory cells of the memory banks 6 of the memory arrangement 1 is reliably ensured in a standby operating mode via a suitably configured row counter unit 8. Since in the example embodiment the memory cells of the memory banks 6 are refreshed time-staggered, peak loads, which would occur with a simultaneous refreshing of memory cells in all the memory banks, can be avoided. Further, in the example embodiment cyclic refreshing of the memory cells of each memory bank is ensured, irrespective of the operating mode in which the memory arrangement is situated.

In other embodiments, if the occurrence of the above-mentioned peak loads is no problem, the refresh processes can also be carried out simultaneously or at least with a time overlap.

Figure 4:
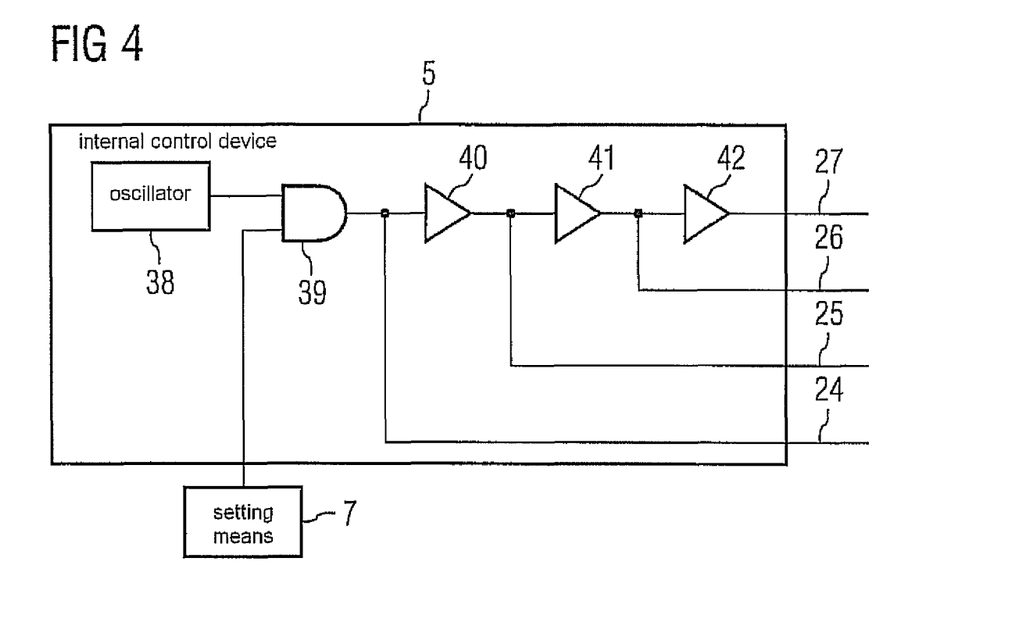
FIG. 4 illustrates an embodiment of an internal control device of a memory arrangement.

FIG. 4 illustrates an embodiment of an internal control device 5, which is suitable for controlling the row counter unit 8 illustrated in FIG. 2. The internal control device 5 comprises an oscillator 38, a release unit 39, and delay elements 40-42. The oscillator 38 generates a periodic signal, which may be similar to signal 24 illustrated in FIG. 3. This signal is fed to a release unit 39, to which the output of the setting means 7 is further fed. When the setting means 7 is set to the active operating mode the output signal of the release unit 39 does not comprise the signal 24 illustrated in FIG. 3, but comprises a signal with a fixed level, for example a low level. Thus, in active operating mode, no controlling of the row counter unit 8 is performed by the internal control device 5.

In one embodiment, in standby operating mode, the output of the release unit 39 corresponds to the signal designated as signal 24 in FIG. 3. This signal is fed directly to the row counter unit 8 via connecting line 24. This signal is further fed to a serial connection of three delay elements 40-42 and thus the delayed signals 25-27 are generated, which are likewise fed to the row counter unit 8 via signal lines 25-27. In this embodiment, with the aid of this simple internal control device 5, it is possible to carry out the previously described time-staggered refreshing of the memory banks 6 in a standby operating mode.

Although time-staggered controlling as described above is advantageous, it is also possible to control the memory banks 6 synchronously and thus to refresh a row of memory cells in each case simultaneously in each of the memory banks 6.

Figure 5:
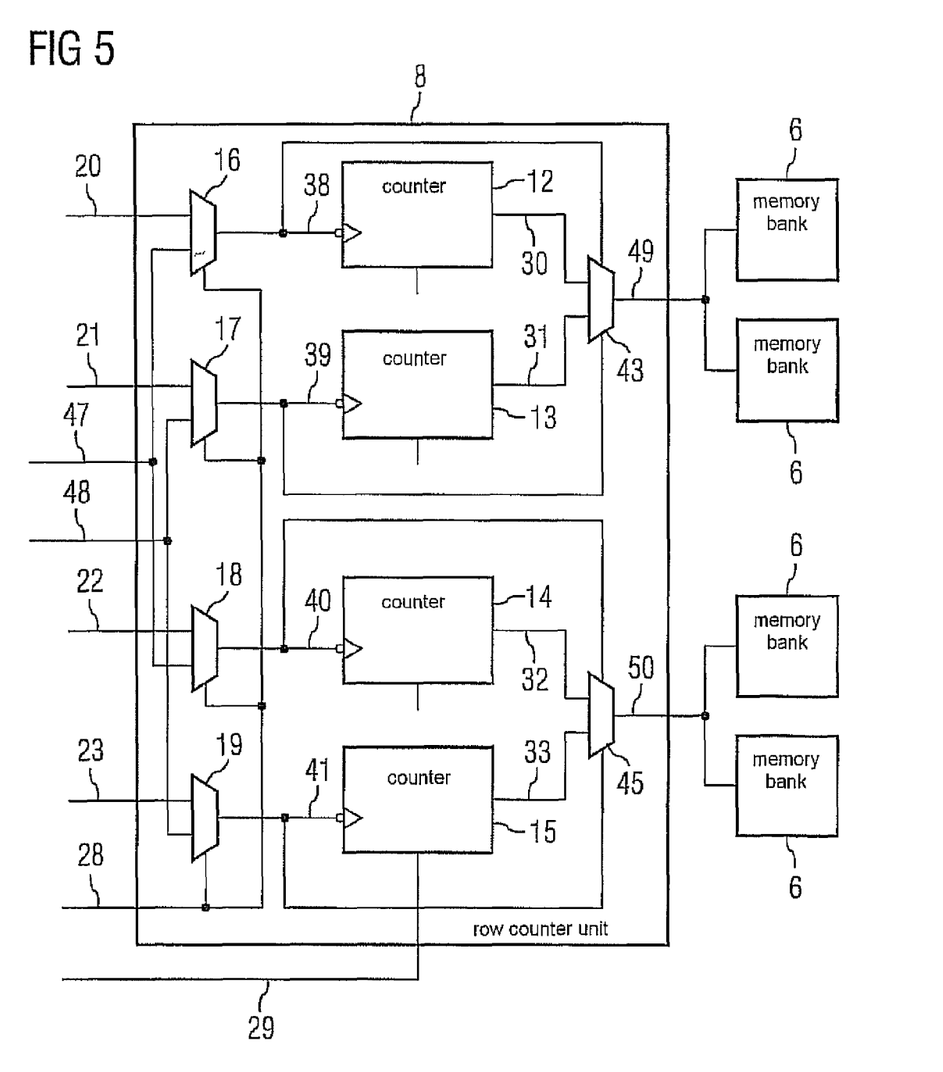
FIG. 5 illustrates an embodiment of a refreshing device for a memory arrangement with four memory banks, combined in two groups with two memory banks in each group.

FIG. 5 illustrates an embodiment of a row counter unit 8, which is configured for refreshing four memory banks 6. In contrast to the row counter unit 8 illustrated in FIG. 2, the row counter unit 8 of FIG. 5 comprises only two connecting lines 47 and 48 to the internal control device 5 and additionally comprises two multiplex units 43 and 45, which are configured to transmit the row addressing information of counters 12 to 15 via connecting lines 49 and 50, which are connected to the memory banks 6, wherein connecting line 49 is connected to a first and a second of the memory banks 6 and connecting line 50 is connected to a third and a fourth of the memory banks 6. Multiplex unit 43 is in this case configured in such a way that it selectively switches through row addressing information 30 of counter 12 or row addressing information 31 of counter 13 to connecting lines 49 depending on the control lines 38 and 39. Analogously, multiplex unit 45 is configured in such a way that it selectively switches through row addressing information 32 of counter 14 or row addressing information 33 of counter 15 to connecting lines 50 depending on the signals of connecting lines 40 and 41.

In one embodiment, in a normal operating mode of the memory arrangement 1, the row counter unit 8 is controlled by the external refresh control 10 as described in connection with FIG. 2. In contrast to the embodiment illustrated in FIG. 2, in the embodiment illustrated in FIG. 5 the row addressing information are not transmitted directly from the counters 12-15 to the memory banks 6 via connecting lines 30-33, but with the aid of the multiplex units 43 and 45 only the row addressing information employed for the refresh process currently being carried out are transmitted to the memory banks 6 via connecting lines 49 and 50. In this embodiment, it is possible to save on connecting lines between the row counter unit 8 and the memory banks 6, where the entire chip surface employed by the memory arrangement can be reduced.

Figure 6:
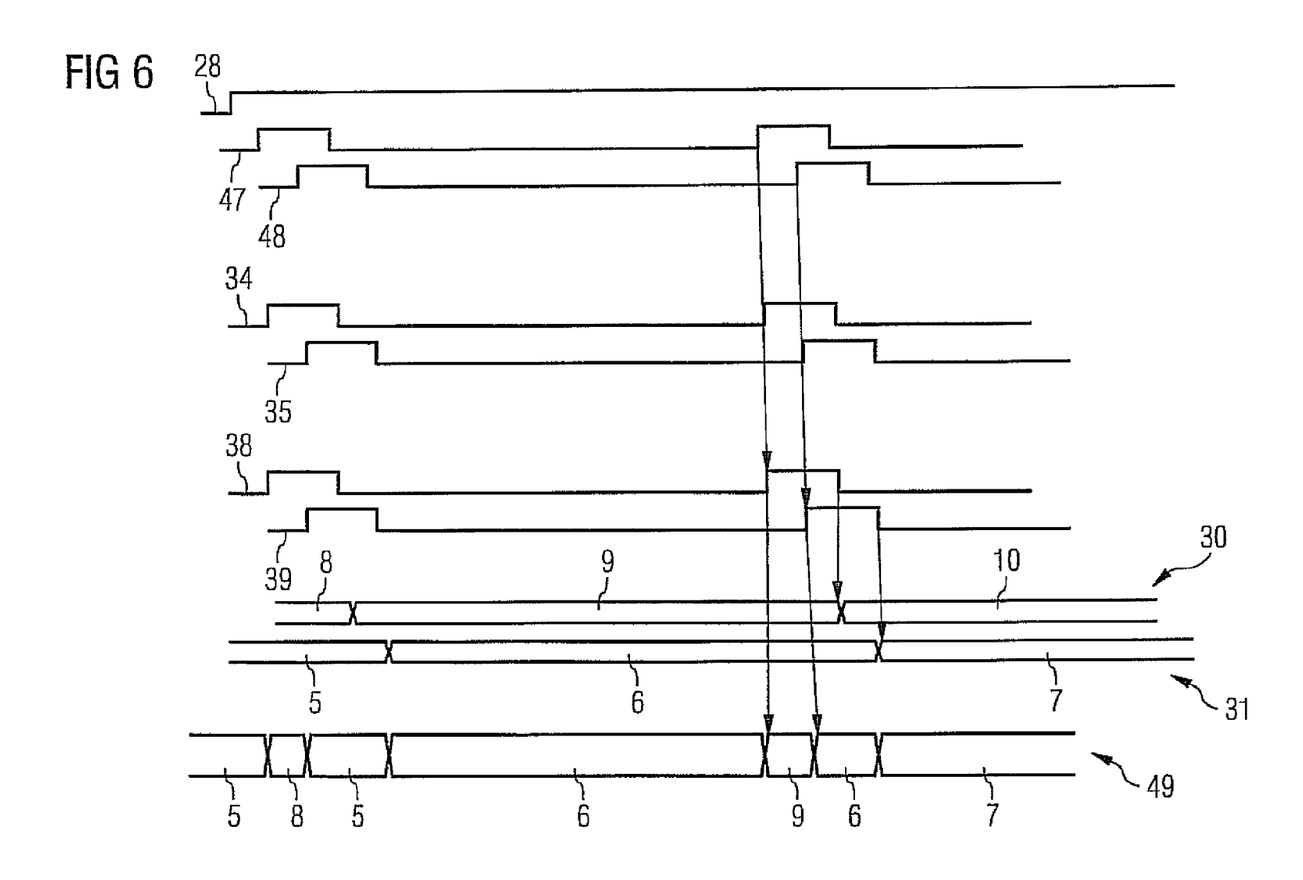
FIG. 6 illustrates an example timing diagram of the refreshing device embodiment illustrated in FIG. 5.

FIG. 6 illustrates according to an embodiment an example timing diagram of the row counter unit 8 illustrated in FIG. 5 in the case of the standby operating mode of the memory arrangement 1. In the standby operating mode the output signal 28 of the setting means 7, as illustrated in FIG. 6, is active. This enables controlling of the row counter unit 8 by the internal refresh control 11 via the switchover units 16-19. FIG. 6 illustrates the timing diagram of the two counters 12 and 13, illustrated at the top in FIG. 5, for the two memory banks 6 arranged at the top in FIG. 5. The signals 47 and 48 of the internal control device 5 are switched through to connecting lines 38 and 39 via the switchover units 16 and 17. In addition to the controlling of counters 12 and 13, as described in connection with FIG. 2, the signals on connecting lines 38 and 39 now also control the multiplex unit 43. As illustrated in FIG. 6, the row addressing information of counters 12 or 13 are transmitted to connecting lines 30 or 31 via connecting line 49 depending on signals 38 and 39 with the aid of multiplex unit 43. Comparably to the two memory banks 6, illustrated at the top in FIG. 5, which are controlled by counters 12 and 13, the memory banks 6 illustrated at the bottom in FIG. 5 are controlled by the corresponding counters 14 or 15.

The row counter unit 8 is controlled by the internal control device 5 via connections 47 and 48, wherein counters 12 and 14 and counters 13 and 15 are controlled simultaneously in each case by the signals of connecting lines 47 and 48, respectively. Correspondingly, memory cells of the memory banks related to counters 12 and 14 or 13 and 15 are in each case simultaneously refreshed.

Figure 7:
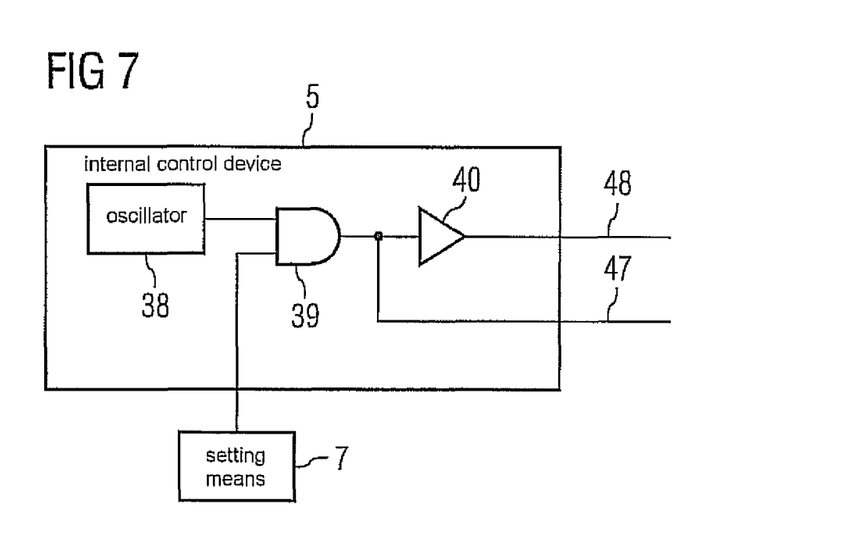
FIG. 7 illustrates an embodiment of an internal control device of a memory arrangement.

FIG. 7 illustrates an embodiment of an internal control device 5, which is configured to control the row counter unit 8 illustrated in FIG. 5. The internal control device 5 comprises an oscillator 38, which generates a periodic signal, which substantially corresponds to signal 47 of FIG. 6. This signal is fed to a release unit 39, to which the output of the setting means 7 is further fed. In one embodiment, in a normal operating mode of the memory arrangement the output of the release unit 39 is, based on the input of the setting means 7, a continuous low level, so there is no controlling of the internal refresh control 11 by the internal control device 5. In one embodiment, in a standby operating mode of the memory arrangement the output of the release unit 39 corresponds substantially to signal 47 which is illustrated in FIG. 6. This output signal is on the one hand fed directly to the row counter unit 8 of FIG. 5 via connecting line 47 and additionally fed to a delay element 40, the output of which is fed to the row counter unit 8 via connecting line 48.

The previously mentioned embodiments of the memory arrangement can be constructed on a semiconductor chip, wherein the memory banks 6 may be dynamic memories (e.g., dynamic random access memories (DRAM)). Furthermore, the number of memory banks 6 used is not restricted to a specific number, but can comprise any number of memory banks (e.g., 16 memory banks). The memory banks can moreover be arranged in groups of memory banks, which are controlled via shared lines, in order to further reduce the chip surface requirement.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of refreshing the content of a memory cell of a memory arrangement, wherein the memory arrangement is operable in an active operating mode and a standby operating mode, the method comprising:

selectively controlling a refreshing device of the memory arrangement via an interface of the memory arrangement or by an internal control device of the memory arrangement to refresh the content of the memory arrangement; and refreshing the content of the memory cell in the active operating mode controlled via the interface and refreshing the content of the memory cell in the standby operating mode controlled by the internal control device;

wherein the memory arrangement is operated-in the standby operating mode if a command to operate the memory arrangement in the standby operating mode has been received via the interface.

2. The method according to claim 1, wherein the memory arrangement comprises several memory cells, and the method comprises:

cyclically refreshing the memory cells in a predetermined order, irrespective of whether the refreshing device is controlled via the interface or by the internal control device.

3. The method according to claim 1, wherein the memory arrangement comprises several memory cells arranged in several memory banks, each memory cell being related to exactly one memory bank, and the method comprises:

cyclically refreshing the memory cells of a memory bank in a predetermined order and refreshing memory cells of a first memory bank of the several memory banks time-staggered in relation to memory cells of a second memory bank of the several memory banks.

4. A method of refreshing the content of a memory cell of a memory arrangement, wherein the memory arrangement is operable in an active operating mode and a standby operating mode, the method comprising:

selectively controlling a refreshing device of the memory arrangement via an interface of the memory arrangement or by an internal control device of the memory arrangement to refresh the content of the memory arrangement; and refreshing the content of the memory cell in the active operating mode controlled via the interface and refreshing the content of the memory cell in the standby operating mode controlled by the internal control device;

wherein the memory arrangement is operated in the standby operating mode if a communication error has been identified by a data packet processing device of the memory arrangement, connected downstream of the interface.

5. The method according to claim 4, wherein the memory arrangement comprises several memory cells, and the method comprises:

cyclically refreshing the memory cells in a predetermined order, irrespective of whether the refreshing device is controlled via the interface or by the internal control device.

6. The method according to claim 4, wherein the memory arrangement comprises several memory cells arranged in several memory banks, each memory cell being related to exactly one memory bank, and the method comprises:

cyclically refreshing the memory cells of a memory bank in a predetermined order and refreshing memory cells of a first memory bank of the several memory banks time-staggered in relation to memory cells of a second memory bank of the several memory banks.

7. A memory arrangement comprising:

an interface configured to transmit data and commands in the form of data packets according to a predetermined protocol;

at least one memory cell;

a refreshing device configured to refresh the content of the at least one memory cell;

an internal control device configured to control the refreshing device;

a switchover device connected to the internal control device, the interface, and the refreshing device, and configured to selectively switch through a signal from the interface or a signal from the internal control device to the refreshing device to control the refreshing of the content of the at least one memory cell; and a setting device con figured to set an operating mode of the memory arrangement, wherein the setting device is configured to set the memory device into an active operating mode or into a standby operating mode, and wherein the setting device is configured to control the switchover device such that in the active operating mode the switchover device switches through the signal from the interface and in the standby operating mode the signal from the internal control device to the refreshing device.

8. The memory arrangement according to claim 7, wherein the internal control device comprises:

an oscillator device configured to periodically generate the signal from the control device to the refreshing device.

9. The memory arrangement according to claim 7, wherein the refreshing device is configured to refresh the memory cells in a predetermined order, irrespective of whether the refreshing device is controlled via the interface or by the internal control device.

10. The memory arrangement according to claim 7, wherein the setting device is configured to set the memory device into the standby operating mode if a command to enter the standby operating mode has been received via the interface according to a predetermined command of a predetermined protocol of the interface.

11. The memory arrangement according to claim 7, wherein the setting device is configured to set the memory device into the standby operating mode if a communication error has been identified by a data packet processing device connected downstream of the interface.

12. The memory arrangement according to claim 7, comprising:
    a standby power supply circuit;
    an active power supply circuit; and
    a switchover device configured to switchover the active power supply circuit between a de-energized and an energized state, wherein the refreshing device, the switchover device, and the at least one memory cell are connected to the standby power supply circuit and the interface is connected to the active power supply circuit and wherein in the standby operating mode the switchover device is configured to switch the active power supply circuit into the de-energized state.

13. The memory arrangement according to claim 7, wherein the refreshing device comprises:
    a counter configured to provide part of the addressing information for refreshing the at least one memory cell and is incremented after each refresh process.

14. The memory arrangement according to claim 13, wherein the memory arrangement comprises several memory cells, arranged in several memory banks, wherein each memory cell is related to exactly one memory bank and wherein in the refreshing device a counter is provided for each memory bank.

15. The memory arrangement according to claim 14, wherein the internal control device is configured to control the counters of the refreshing device with a time stagger.

16. A memory arrangement comprising:
    an interface configured to transmit data and commands in the form of data packets according to a predetermined protocol;
    at least one memory cell;
    a refreshing device configured to refresh the content of the at least one memory cell;
    an internal control device configured to control the refreshing device;
    a switchover device connected to the internal control device, the interface, and the refreshing device, and configured to selectively switch through a signal from the interface or a signal from the internal control device to the refreshing device to control the refreshing of the content of the at least one memory cell;
    several memory cells, arranged in two memory banks, wherein each memory cell is related to either a first of the two memory banks or a second of the two memory banks;
    wherein the refreshing device comprises a first counter related to the first memory bank and a second counter related to the second memory bank;
    connecting lines between the counters and the memory banks for addressing the memory cells in the memory banks; and
    at least one multiplex device configured to at a first time connect the first counter to the first memory bank via the connecting lines and at a second time connect the second counter to the second memory bank via the connecting lines.

* * * * *